US011894413B2

(12) United States Patent
Tchoulfian et al.

(10) Patent No.: US 11,894,413 B2
(45) Date of Patent: Feb. 6, 2024

(54) METHOD FOR PRODUCING AN OPTOELECTRONIC DEVICE COMPRISING LIGHT-EMITTING DIODES WHICH ARE HOMOGENEOUS IN DIMENSIONS

(71) Applicant: ALEDIA, Échirolles (FR)

(72) Inventors: Pierre Tchoulfian, Grenoble (FR); Benoît Amstatt, Grenoble (FR)

(73) Assignee: ALEDIA, Échirolles (FR)

( * ) Notice: Subject to any disclaimer, the term of this patent is extended or adjusted under 35 U.S.C. 154(b) by 358 days.

(21) Appl. No.: 17/288,388

(22) PCT Filed: Oct. 17, 2019

(86) PCT No.: PCT/FR2019/052464
§ 371 (c)(1),
(2) Date: Apr. 23, 2021

(87) PCT Pub. No.: WO2020/084226
PCT Pub. Date: Apr. 30, 2020

(65) Prior Publication Data
US 2021/0384253 A1 Dec. 9, 2021

(30) Foreign Application Priority Data
Oct. 23, 2018 (FR) ...................................... 18/59791

(51) Int. Cl.
*H01L 27/15* (2006.01)
(52) U.S. Cl.
CPC .................................. *H01L 27/156* (2013.01)
(58) Field of Classification Search
None
See application file for complete search history.

(56) References Cited

U.S. PATENT DOCUMENTS 9,368,549 B1 * 6/2016 Oraw .................... H01L 33/486
10,084,012 B2 9/2018 Hugon
(Continued)

FOREIGN PATENT DOCUMENTS

FR 3031238 A1 7/2016
FR 3053530 A1 1/2018
(Continued)

OTHER PUBLICATIONS

English Translation International Search Report for Application No. PCT/FR2019/052464.
(Continued)

*Primary Examiner* — Evren Seven
(74) *Attorney, Agent, or Firm* — CANTOR COLBURN LLP

(57) ABSTRACT

A method for manufacturing an optoelectronic device including the steps of forming a substrate having a support face; forming a first series of first areas adapted to the formation of all or part of light-emitting diodes, forming a second series of second areas on the support face, adapted to the formation of light confinement wall elements capable of forming a light confinement wall, the second areas defining therebetween sub-pixel areas; forming, from the first areas, light-emitting diodes; forming, by the same technique as in the previous step, from the second areas, light confinement wall elements, concomitantly with all or part of the light-emitting diodes which are formed in the previous step.

22 Claims, 6 Drawing Sheets

(56) References Cited

U.S. PATENT DOCUMENTS

| | | | |
|---|---|---|---|
| 10,923,528 B2 | 2/2021 | Dupont et al. | |
| 11,302,841 B1* | 4/2022 | Oyer | H01L 33/06 |
| 2011/0229993 A1* | 9/2011 | Hsieh | H01L 33/508 |
| | | | 438/33 |
| 2011/0297969 A1* | 12/2011 | Kojima | H01L 33/50 |
| | | | 257/E33.013 |
| 2015/0155331 A1* | 6/2015 | Guenard | H01L 27/153 |
| | | | 438/34 |
| 2017/0345867 A1* | 11/2017 | Chaji | H01L 33/405 |
| 2018/0151804 A1* | 5/2018 | Chaji | H10K 71/00 |
| 2018/0287027 A1* | 10/2018 | Chaji | H01L 27/153 |
| 2018/0331251 A1* | 11/2018 | Scholz | H01L 33/382 |

FOREIGN PATENT DOCUMENTS

| | | |
|---|---|---|
| JP | H06224469 A | 8/1994 |
| WO | 03012884 A1 | 2/2003 |
| WO | 2018002485 A1 | 1/2018 |

OTHER PUBLICATIONS

International Search Report for Application No. PCT/FR2019/052464.

Written Opinion for Application No. PCT/FR2019/052464.

\* cited by examiner

METHOD FOR PRODUCING AN OPTOELECTRONIC DEVICE COMPRISING LIGHT-EMITTING DIODES WHICH ARE HOMOGENEOUS IN DIMENSIONS

CROSS REFERENCE TO RELATED APPLICATIONS

This application is a National Stage of PCT Application No. PCT/FR2019/052464 filed on Oct. 17, 2019, which claims priority to French Patent Application No. 18/59791 filed on Oct. 23, 2018, the contents each of which are incorporated herein by reference thereto.

TECHNICAL FIELD

The present invention concerns a method for manufacturing an optoelectronic device including a plurality of light-emitting diodes.

The invention also concerns an optoelectronic device as such.

The invention finds application in particular in the display screens or the image projection systems.

BACKGROUND

The term «optoelectronic device» means herein a device adapted to perform the conversion of an electrical signal into electromagnetic radiation to be emitted, in particular light.

There are optoelectronic devices including light-emitting diodes, also known by the acronym LED for «light-emitting diode», formed on a substrate.

It is known that each light-emitting diode comprises a semiconductor portion doped according to a first type of doping to act as a doped portion N, another portion including an active area exploiting or not exploiting quantum wells, and a third semiconductor portion doped according to a second type of doping to act as a doped portion P.

Each light-emitting diode can be formed based on three-dimensional or two-dimensional semiconductor elements, themselves at least partially obtained by epitaxial growth using techniques such as the MBE «Molecular Beam Epitaxy», or the MOVPE «Molecular Organic Vapor Phase Epitaxy» or the metal organic chemical vapor deposition (MOCVD) or by plasma enhanced chemical vapor deposition or by (PECVD) or by PVD (physical vapor deposition). The light-emitting diodes are typically formed from semiconductor materials comprising, for example, elements from column III and column V of the periodic table, such as a III-V compound, in particular gallium nitride (GaN), indium gallium nitride (InGaN) or aluminum gallium nitride (AlGaN).

There are optoelectronic devices including a matrix of light-emitting diodes having a certain emission surface through which the light radiation emitted by the light-emitting diodes is transmitted. Such optoelectronic devices can in particular be used in the constitution of display screens or image projection systems, where the matrix of light-emitting diodes in fact defines a matrix of light pixels where each pixel includes at least one sub-pixel containing itself at least one light-emitting diode. A sub-pixel can for example contain from 1 to 100,000 light-emitting diode(s).

One of the difficulties is to ensure that the light radiation emitted by the light-emitting diodes of one sub-pixel does not mix with the light radiation emitted by the light-emitting diodes of an adjacent sub-pixel in order to improve the contrasts. In particular, one problem is to succeed in avoiding crosstalk-type color excitations between the sub-pixels, a phenomenon also known under the name of «cross-talk» in the concerned technical field. However, this problem is proving more and more difficult to solve given the increasing miniaturization of the light-emitting diodes.

A known solution consists in forming light confinement walls capable of blocking the transmission of the light radiation emitted by at least one given light-emitting diode to at least one adjacent light-emitting diode.

A known technique for forming such light confinement walls consists in carrying out an additional step, after the formation of the light-emitting diodes, by depositing a resin layer on the light-emitting diodes, the resin being photolithographed by respecting a pattern guaranteeing the presence of trenches intended to then be filled with a material, for example by a growth technique, capable of blocking the light radiation or even ensuring the reflection thereof.

This technique has the drawback that it is difficult to respect an accurate alignment between the confinement walls and the light-emitting diodes. This problem is all the more present given the increasing miniaturization of the light-emitting diodes in order to ultimately obtain a high resolution.

Another difficulty is to be able to obtain light-emitting diodes in the same sub-pixel which are homogeneous therebetween in terms of height and width when said light-emitting diodes are disposed on the edges of rows. For example, when a two-dimensional arrangement of light-emitting diodes ends, the supply of material around the border light-emitting diodes is in excess relative to the situation of light-emitting diodes which are completely surrounded by other light-emitting diodes. This results in light-emitting diodes of very different height and width, if they are at the periphery, relative to the average dimensions of the same area. The state of the art shows that the average diameter of the light-emitting diode elements located at the periphery is on average greater than 20% than the average diameter of the light-emitting diode elements of the area. It is the same for the heights.

This also results in parasitic deposits of material in the areas where the light-emitting diode density is lower.

These phenomena are summed up by «the edge effec».

Another difficulty is to be able to manufacture light-emitting diodes whose wavelength emitted by each diode does not vary by more than 2% over an entire sub-pixel.

To address the problem of difference in diameter of the light-emitting diodes located at the periphery, those skilled in the art may consider retouching the dimensions of the masks which are preliminary to the formation of the light-emitting diode elements located at the periphery. This has a significant cost since it involves the extremely meticulous retouching of the photolithography masks.

BRIEF SUMMARY

The present invention aims at responding to all or part of the problems which are presented above.

In particular, one object is to provide a solution which meets at least one of the following objectives:
  obtaining a homogeneity of the heights and widths of the light-emitting diodes of the same area or sub-pixel,
  obtaining a homogeneity of wavelength emission between light-emitting diodes of the same area, reducing parasitic deposits which are deposited in the areas where the light-emitting diodes are absent,
  reducing the number of steps of manufacturing light confinement walls.

facilitating the positioning of the light confinement walls relative to the light-emitting diodes.

This object can be achieved thanks to the implementation of a method for manufacturing an optoelectronic device including a step a) of forming a substrate having a support face. The method also includes a step b) of forming a first series of first areas on the support face which are adapted to the formation of all or part of light-emitting diodes, said light-emitting diodes comprising a first portion doped according to a first type of doping, a second portion forming an active area and a third portion doped according to a second type of doping. The method further includes a step c) of forming a second series of second areas on the support face, which are adapted to the formation of at least one light confinement wall element capable of forming a light confinement wall, the second areas being distinct from the first areas, the second areas defining therebetween sub-pixel areas. An additional step d) of the method consists in forming, from the first areas, all or part of light-emitting diodes. Finally, the method includes a step e) of forming, by the same technique as in step d), from the second areas, all or part of light confinement wall elements, concomitantly with all or part of the light-emitting diodes which are formed in step d).

Some preferred but non-limiting aspects of the method are as follows.

At least two of the second areas adapted to the formation of light confinement wall elements are arranged to allow obtaining light confinement walls by coalescence of light confinement wall elements.

All or part of the second areas adapted to the formation of light confinement wall elements are arranged to allow the formation of the light confinement wall elements in one piece.

The light confinement walls at least partially contain portions made of electrically insulating material.

The light-emitting diodes have a wire shape which is elongate along a longitudinal axis, extending in a transverse direction of the optoelectronic device oriented transversely to the support face.

The first, second and third portions of the light-emitting diodes are stacked parallel to the support face.

All or part of the light-emitting diodes of the same sub-pixel area are positioned at a distance D1 relative to the light confinement wall elements, the distance satisfying at least one of the following conditions:
  the distance D1 is comprised between half and 100 times the pitch separating all or part of two adjacent light-emitting diodes,
  the distance D1 is comprised between one time and 500 times the diameter of all or part of the light-emitting diodes,
  the distance D1 is less than or equal to twice the diffusion length of the atomic species composing all or part of the light-emitting diodes.

The light confinement wall elements which are formed in step e) have an ability to capture all or part of the material used in step d) for the formation of the first, second and third portions of light-emitting diode.

The light confinement wall elements are formed, in whole or in part, substantially of the same materials as the first, second and third portions of light-emitting diodes.

All or part of the light confinement walls is made concomitantly with the formation of the first portion of the light-emitting diodes, and concomitantly with the formation of the second portion of the light-emitting diodes.

The light confinement walls comprise a first element doped according to a first type of doping formed concomitantly with the first portion doped according to a first type of doping of the light-emitting diodes, the light confinement walls further comprising a second element, capable of constituting an active area, obtained concomitantly with the second portion forming the active area of the light-emitting diodes.

The method includes an additional step f), implemented after step e), of forming a layer of an electrically insulating material, said electrically insulating material layer being formed, selectively, on the outer surfaces of the light confinement walls, on the surfaces defined by the spacing between the light confinement walls and the light-emitting diodes, and on the surfaces defined by the spacing between all or part of the light-emitting diodes.

The method includes a step g) of forming an upper electrode on the surface free of electrically insulating material resulting from step f).

Each light confinement wall is electrically insulated from at least one element selected from: the other light confinement walls of the sub-pixel area, all or part of the upper electrodes and all or part of conductive portions of the substrate.

The light confinement walls do not emit light.

The method comprises a step h) of forming a layer of a material blocking electromagnetic waves from or in the direction of the light-emitting diodes, said layer of material blocking the electromagnetic waves being formed on the free surfaces resulting from step g) with the exception of the lateral and top surfaces of the light-emitting diodes.

The layer of material which is opaque or reflecting the electromagnetic waves, is formed directly on all or part of the outer surfaces of the light confinement walls, on all or part of the surfaces defined by the spacing between the light confinement walls and the light-emitting diodes and on all or part of the surfaces defined by the spacing between the light-emitting diodes with the exception of the lateral and top walls of the light-emitting diodes.

The layer of material blocking the electromagnetic waves, is formed directly on all or part of the free surfaces of the insulating material layer which are obtained in step f), with the exception of the lateral and top walls of the light-emitting diodes.

The method comprises a step i) of forming an encapsulation layer at least partially surrounding the light-emitting diodes contained in the same sub-pixel area.

The invention also relates to an optoelectronic device obtained by implementing a manufacturing method according to the invention where all or part of the light confinement walls are formed of the same materials as all or part of the first, second and third portions of light-emitting diodes.

Some preferred but non-limiting aspects of this optoelectronic device are as follows.

All light-emitting diodes comprised in the same sub-pixel area have a diameter comprised between 0.8 times the average diameter of the light-emitting diodes of the sub-pixel area and 1.2 times the average diameter of the light-emitting diodes of the sub-pixel area and a height comprised between 0.8 times the average height of the light-emitting diodes of the sub-pixel area and 1.2 times the average height of the light-emitting diodes of the sub-pixel area.

All light-emitting diodes comprised in the same sub-pixel area emit a light of a wavelength comprised between 0.98 times the average wavelength of the light emitted by the light-emitting diodes of the sub-pixel area and 1.02 times the average wavelength of the light emitted by the light-emitting diodes of the sub-pixel area.

BRIEF DESCRIPTION OF THE DRAWINGS

Other aspects, objects, advantages and features of the invention will become more apparent on reading the following detailed description of preferred embodiments thereof, given by way of non-limiting example, and made with reference to the appended drawings on which.

DETAILED DESCRIPTION

Figure 1:
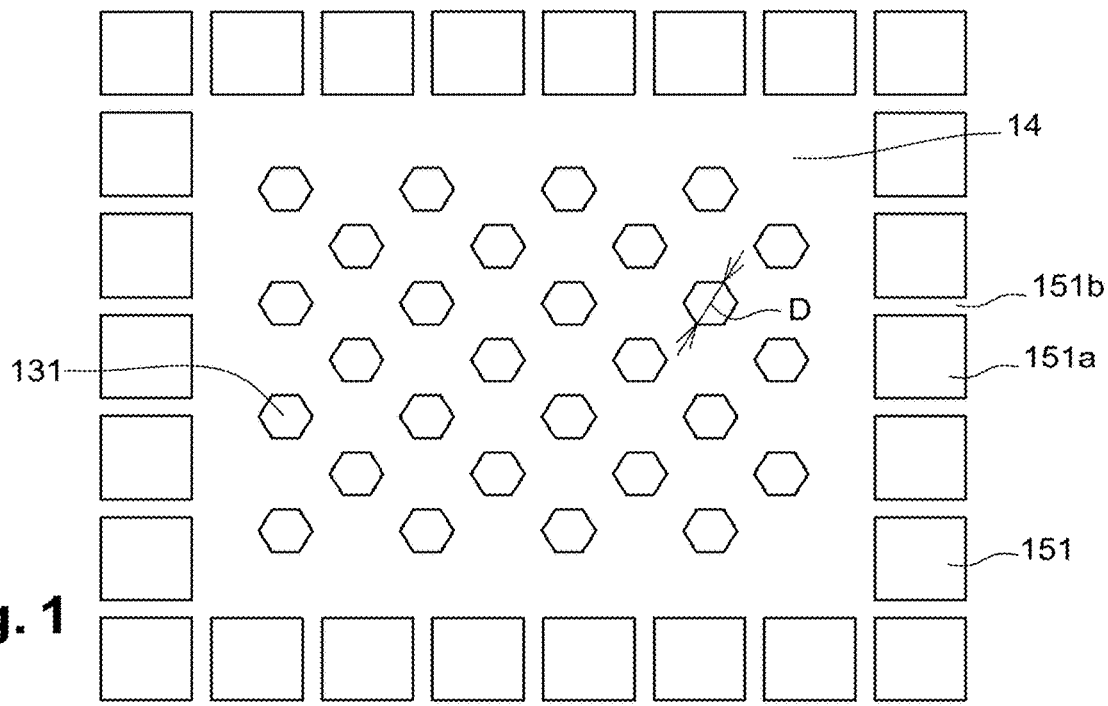
FIG. 1 represents a top view of an example of creation of areas preliminary to the formation of light-emitting diode portions, on the one hand, and of areas preliminary to the formation of light confinement wall elements, on the other hand.

In the figures and in the following description, the same references represent the identical or similar elements. In addition, the different elements are not represented to scale so as to favor the clarity of the figures. Moreover, the different embodiments and variants are not mutually exclusive and can be combined with each another.

In the following description, unless otherwise indicated, the terms "substantially", "about" and "in the range of" mean "to within 10%".

FIG. 1 or 2, 5 to 9 are partial top and sectional views of different steps of a first example of implementation of a manufacturing method according to the invention.

For illustrative purposes only, but without any limitation, each of FIGS. 5 to 9 or 12 and 15 represents only an assembly comprising three light-emitting diodes 13 and two light confinement walls 15. The number of light-emitting diodes 13 and light confinement walls 15 is not, however, limited to the particular examples illustrated in the figures.

The invention relates firstly to a method for manufacturing an optoelectronic device 10 including light-emitting diodes 13, arranged in sub-pixel areas 14 which are defined by the opposite light confinement walls 15, said light-emitting diodes 13 of the same sub-pixel area 14 having a homogeneity of dimensions therebetween which is improved relative to the prior art.

It also relates to an optoelectronic device 10 as such, resulting from the method.

Thanks to the arrangement of the sub-pixel areas 14 of light-emitting diodes 13, a particularly targeted application is the provision of an image display screen or an image projection device.

It is also clear that the invention can target other applications, in particular the detection or measurement of electromagnetic radiation or even photovoltaic and lighting applications.

FIGS. 5 to 8 illustrate different steps of a first example of implementation of a manufacturing method according to the invention.

In a first step which is not represented and common to the different embodiments, the manufacturing method comprises a step of forming a substrate 11 having a support face 111.

The substrate 11 is constituted for example by a stack of a monolithic layer (not represented), a lower electrode layer (not represented) which can be a conductive seed layer and of a first electrical insulation layer (not represented). Those skilled in the art can refer for example to the patent FR3053530 to implement such a substrate.

The support face 111 of the substrate 11 consists for example of the free face of said first electrical insulation layer.

The monolithic layer can be formed of a doped or non-doped semiconductor material, for example $Al_2O_3$ or silicon or even germanium, and more particularly monocrystalline silicon. It can also be formed of sapphire or even of a semiconductor material III-V, for example of GaN. It may alternatively consist of a substrate of the silicon on insulator type «SOI». Alternatively, the monolithic layer can be formed of an electrically insulating material.

The lower electrode layer can serve as a seed layer for the growth of light-emitting diode portions 13a, 13b, 13c or light confinement wall elements 152. The lower electrode layer can be continuous or discontinuous. The material composing the lower electrode layer may be a nitride, a carbide or a boride of a transition metal of the column IV, V or VI of the periodic table of elements or a combination of these compounds. By way of example, the lower electrode layer can be made of aluminum nitride, of aluminum oxide, of boron, of boron nitride, of titanium, of titanium nitride, of tantalum, of tantalum nitride, of hafnium, of hafnium nitride, of niobium, of niobium nitride, of zirconium, of zirconium boride, of zirconium nitride, of silicon carbide, of tantalum nitride and carbide, or of magnesium nitride in the form of $Mg_xN_y$, where x is equal to about 3 and y is equal to about 2, for example magnesium nitride in the form $Mg_3N_2$. The lower electrode layer can be doped and of the same type of conductivity as that of the semiconductor elements intended to grow, and have a thickness for example comprised between 1 nm and 200 nm, preferably comprised between 10 nm and 50 nm. The lower electrode layer may be composed of an alloy or a stack of at least one material mentioned in the list hereinabove.

Said first electrical insulation layer may comprise a first intermediate insulating layer which covers said lower electrode layer. It forms a growth mask enabling, for example, the epitaxial growth of the first doped portions 13a of the light-emitting diodes 13 from through-openings opening locally on the surfaces of the lower electrode layer. Said first electrical insulation layer also forms a growth mask enabling, for example, the epitaxial growth of the confinement wall elements 152 from through-openings opening locally on the surfaces of the lower electrode layer.

Said first electrical insulation layer also participates in ensuring the electrical insulation between the first lower electrodes (not represented) and the second upper electrodes 17. The first intermediate insulating layer is made of at least one dielectric material(s) such as, for example, a silicon oxide (for example $SiO_2$ or SiON) or a silicon nitride (for example $Si_3N_4$ or SiN), or else a silicon oxynitride, an aluminum oxide (for example $Al_2O_3$) or a hafnium oxide (for example $HfO_2$). The thickness of the first intermediate insulating layer may be comprised between 5 nm and 1 μm, preferably comprised between 20 nm and 500 nm, for example equal to about 100 nm.

Said first layer of electrically insulating material may further include a second intermediate electrical insulating layer (not represented) which covers the first lower electrodes and participates in ensuring the electrical insulation between the first lower electrodes and the second upper electrodes. Said second intermediate electrically insulating layer may also cover the growth mask formed by the first intermediate insulating layer. The second intermediate insulating layer can be made of a dielectric material which is identical to or different from that of the growth mask, such as, for example, a silicon oxide (for example $SiO_2$) or a silicon nitride (for example $Si_3N_4$ or SiN), or else a silicon oxynitride, or a hafnium oxide (for example $HfO_2$). The thickness of the second intermediate insulating layer may be comprised between 5 nm and 1 μm, preferably comprised between 20 nm and 500 nm, for example equal to about 100 nm.

Figure 2:
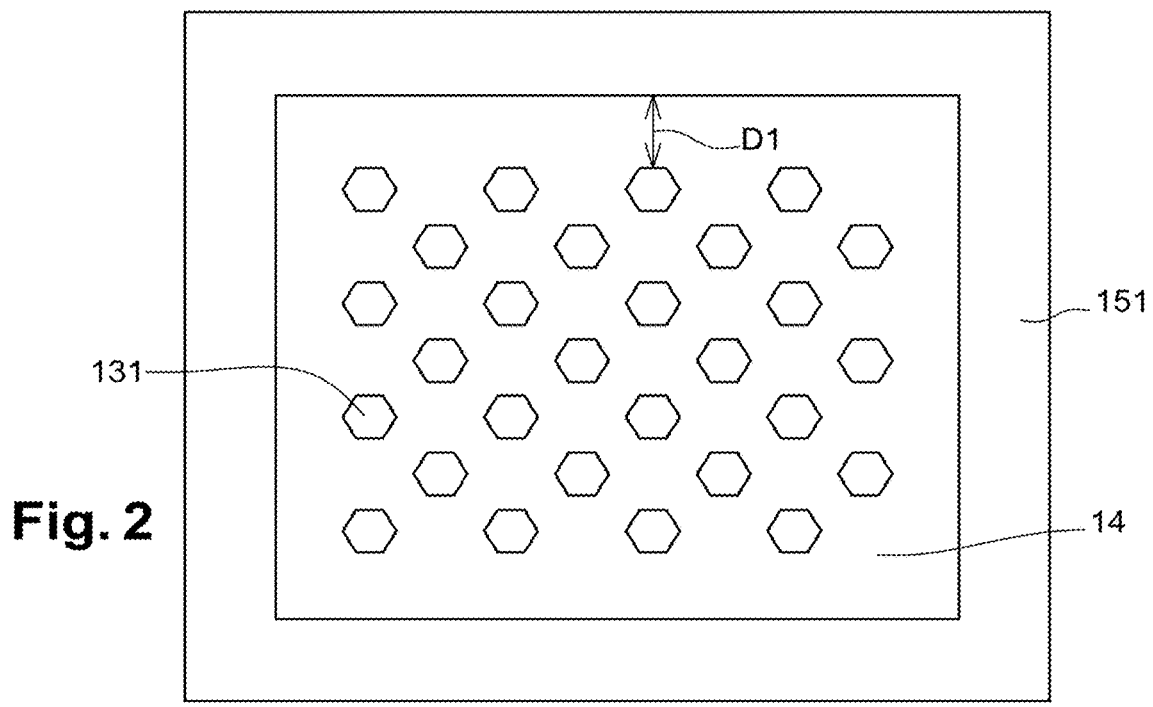
FIG. 2 represents a top view of a variant of FIG. 1 where the areas preliminary to the formation of light confinement wall elements are formed in one piece.
Figure 3:
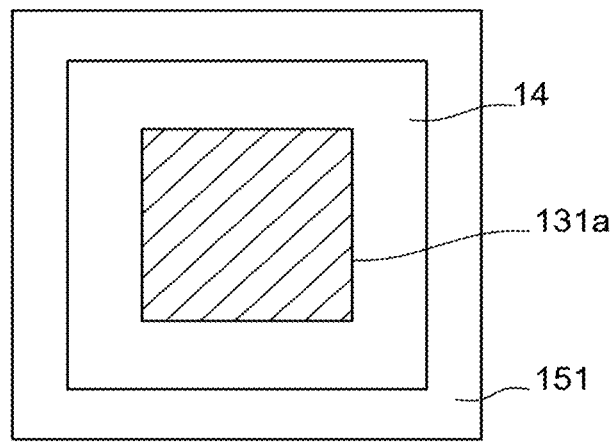
FIG. 3 represents a top view of a variant of FIG. 2.

First, with reference to FIGS. 1, 2 and 3, a second step called b), common to the different embodiments, is the formation of a first series of first areas 131, 131a which are adapted to the formation of light-emitting diode portions 13a, 13b, 13c on the support face 111.

Each area 131, 131a adapted to the formation of first portions 13a of light-emitting diodes 13 may be formed for example by openings which are obtained through said first electrically insulating layer and opening onto the lower electrode layer. These openings can also be in whole or in part filled with seed materials as previously described. This deposit, delimited by the openings in the first insulating layer, constitutes seed pads allowing facilitating the growth of light-emitting diode elements 13a, 13b, 13c and light confinement wall elements 152. For example, the material constituting the seed pads can be a transition metal of the column IV, V or VI of the periodic table of elements or a nitride, a carbide or a boride of a transition metal of the column IV, V or VI, or a combination of these compounds.

Referring first to FIGS. 1, 2 and 3, a third step called c), common to the different embodiments, is the formation of a second series of second areas 151, 151a which are adapted to the formation of light confinement wall elements 152 on the support face 111.

Each area 151, 151a adapted to the formation of light confinement wall elements 152 can be formed for example by openings obtained through said first electrically insulating layer and opening onto the lower electrode layer. These openings can also be in whole or in part filled with seed materials as previously described.

Preferably, steps b), c) are carried out in whole or in part at the same time and according to the same techniques, this allows saving method time and gaining in accuracy.

A fourth step called d), common to the different embodiments, is the successive formation of portions 13a, 13b, 13c of light-emitting diodes from areas 131, 131a.

Figure 4:
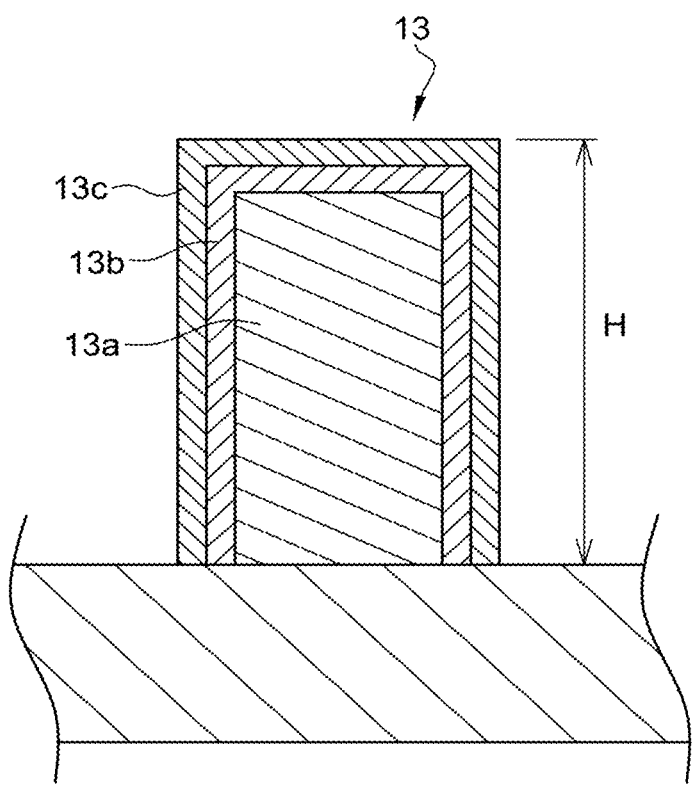
FIG. 4 illustrates a cross section of a three-dimensional light-emitting diode.
Figure 5:
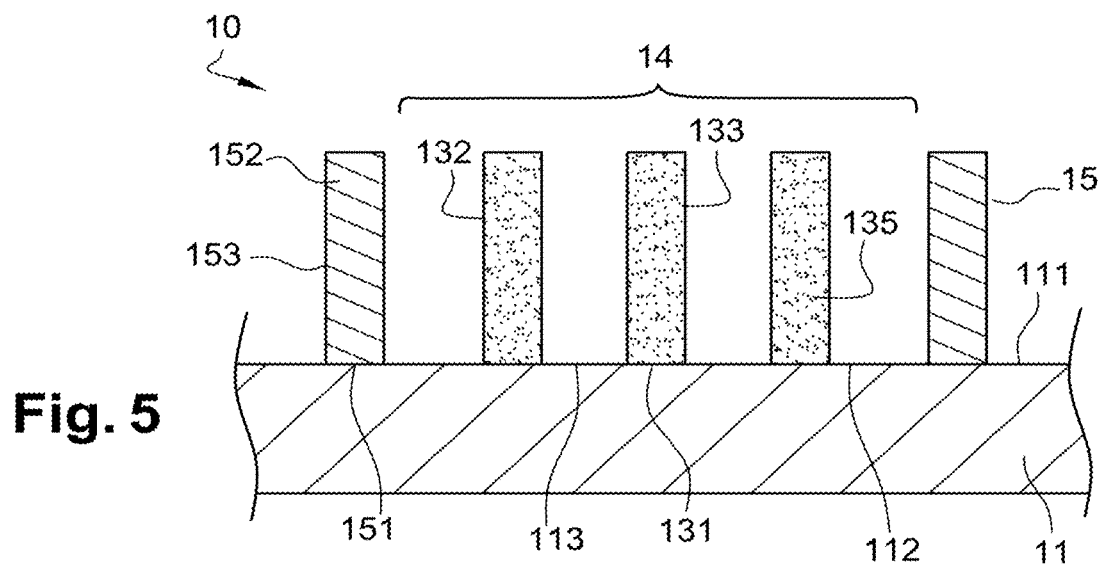
FIGS. 5 to 8 represent, in side section, successive steps of an example of a manufacturing method according to the invention which are implemented from the situation of FIG. 1 or 2.

In general, each light-emitting diode 13 comprises semiconductor elements including a first portion 13a doped according to a first type of doping, a second portion 13b forming an active portion and a third portion 13c doped according to a second type of doping. These semiconductor elements can be arranged according to a two-dimensional organization or, as represented in FIG. 4, three-dimensionally, according to micrometric or nanometric dimensions. Preferably, the semiconductor elements of the light-emitting diodes 13a, 13b, 13c of each sub-pixel area 14 have a substantially wire, conical or frustoconical shape. In the following text, the terms «light-emitting diode element» refer to a first portion doped according to a first type of doping 13a and/or a second portion 13b forming an active portion and/or a third portion doped according to a second type of doping 13c, as well as the stacking of these different portions.

In the following description and in the figures, the embodiments are described for three-dimensional light-emitting diodes 13 of the heart-shell type as shown in FIG. 4. However, these embodiments can be indifferently implemented for three-dimensional light-emitting diodes 13 having an axial structure where the first doped portion 13a, the active portion 13b and the third doped portion 13c are stacked in a direction transverse to the plane of the substrate 11. The embodiments can also be applied for light-emitting diodes having a stack of layers parallel to the support face 111 of a first portion 13a, a second portion 13b and a third portion 13c. Unlike the embodiments shown in FIGS. 1 and 2, having a multitude of areas 131 to form a multitude of light-emitting diodes per sub-pixel area 14, an embodiment shown in FIG. 3 discloses a single light-emitting diode per sub-pixel area 14, the light-emitting diode 13 being further composed of at least one first doped portion 13a according to a first doping, a second portion forming an active area 13b and a third portion doped according to a second type of doping, the stack of these three layers being parallel to the support face 111. In the latter embodiment, the method according to the invention will allow homogenizing the thicknesses of the layers 13a, 13b, 13c, between the outer edges of the light-emitting diode 13 and the center thereof.

In general, each first portion 13a of light-emitting diode 13a of the same sub-pixel area 14 is connected to a first lower electrode, formed in the substrate (not represented and which may be the seed layer), continuous or not. Those skilled in the art can refer to the patent FR3053530 to produce the substrate containing the appropriate lower electrodes. An upper electrode 17 in contact with the third doped portions 13c is formed on all light-emitting diodes 13 of the same sub-pixel area 14.

It should be understood in the text that the terms "diameter" or "average diameter" of a wire or a light-emitting diode 13 or a layer deposited around or on a light-emitting diode 13 designate a diameter quantity which is associated to the surface of the straight cut of the wire 13 or to the light-emitting diode 13, for example, this corresponds to the diameter of the disc whose area is equivalent to that of the straight cut of the diode 13.

As represented in FIG. 4, each light-emitting diode 13 may have a wire shape formed by the three-dimensional stack of a first portion doped according to a first type of doping 13a, of a second portion 13b and of a third portion 13c, the stack extending transversely to the plane of the first face 111. In the text the terms «wire» and «light-emitting diode elements» are equivalent.

By way of example, the light-emitting diodes 13 can be, at least partially, formed from semiconductor materials of group IV such as silicon or germanium or else mainly including a compound III-V, for example compounds III-N.

Examples of the group III comprise gallium, indium, or aluminum. Examples of compounds III-N are GaN, AlN, InGaN or AlInGaN. Other elements of the group V can also be used, for example, phosphorus, arsenic or antimony. In general, the elements in the compound III-V can be combined with different mole fractions. It should be specified that the light-emitting diodes 13 can indifferently be formed from semiconductor materials predominantly including a compound II-VI. The dopant can be selected, in the case of a compound III-V, from the group comprising a P-type dopant of the group II, for example magnesium, zinc, cadmium or mercury, a P-type dopant of the group IV, for example, carbon, or a N-type dopant of the group IV, for example silicon, germanium, selenium, sulfur, terbium or tin.

The straight section of the wires 13 can have different shapes such as, for example, an oval, circular or polygonal shape (for example square, rectangular, triangular, hexagonal). In FIGS. 1 and 2, the shape of the straight section of the light-emitting diodes 13 is hexagonal, in FIG. 3, the straight section is rectangular.

The active layer 13b is the layer from which the majority of the radiation provided by the light-emitting diode 13 is emitted. It may include means for confining electrical charge carriers, such as quantum wells. It is, for example, constituted of an alternation of GaN and InGaN layers. The GaN layers can be doped. Alternatively, the active layer is constituted by a single InGaN layer.

In general, the different layers 13a, 13b, 13c constituting the light-emitting diodes 13 can be obtained by any technique of those skilled in the art such as for example: a chemical vapor deposition (CVD), an atomic layer deposition (ALD), or physical vapor deposition (PVD) or else by epitaxy (for example MBE, MOVPE).

A fifth step called e), common to the different embodiments, is the formation of light confinement wall elements 152 from areas 151, 151a.

The term «light confinement walls elements 152» means the portions of the light confinement walls 15 formed during step e) which takes place in whole or in part at the same time as the formation of the light-emitting diode elements 13a, 13b, 13c. A light confinement wall element 152 may for example consist of a first portion which is substantially identical (in material composition and in thickness) to the first portion 13a of a light-emitting diode 13 or even include a second portion which is substantially identical (in material composition and in thickness) to a second portion 13b of light-emitting diode 13 or even include a third portion which is substantially identical (in material composition and in thickness) to a third portion 13c of light-emitting diode 13. The light confinement wall elements 152 can be considered as being themselves light confinement walls 15.

Advantageously, the light confinement wall elements 152 are arranged so as to obtain a dispersion of less than 20% in heights and in widths of the light-emitting diodes 13 contained in the same sub-pixel area 14 and this without any additional step relative to the steps of forming the light-emitting diodes 13.

Advantageously, the confinement wall elements 152 are obtained at the same time and by the same technique as the light-emitting diode elements 13. Thus the formation of the light confinement wall elements 152 will influence the formation of the light-emitting diode elements 13a, 13b, 13c.

Figure 10:
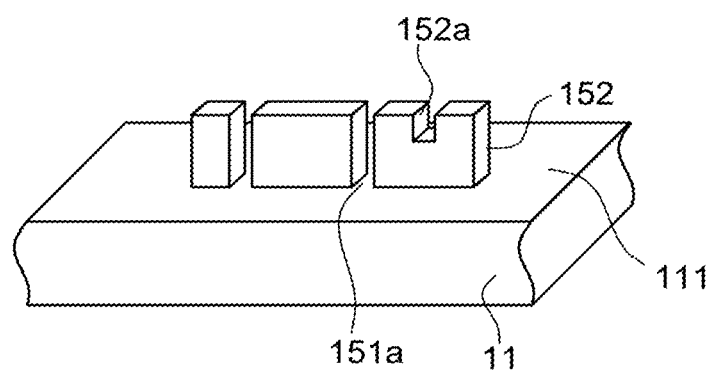
FIG. 10 illustrates a perspective view of the formation of light confinement wall elements.
Figure 11:
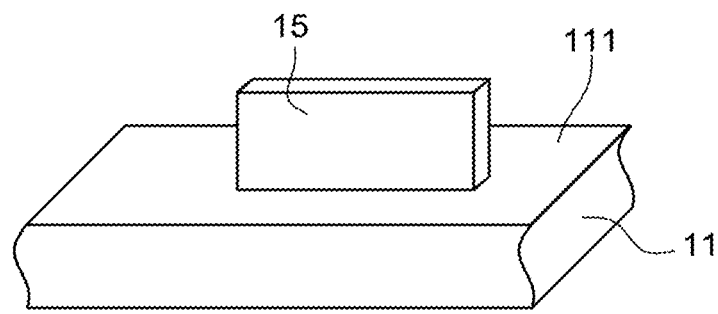
FIG. 11 represents a perspective view of light confinement walls.

As illustrated in FIGS. 10 and 11, the light confinement wall elements can coalesce in whole or in part during step e).

Preferably, the coalescence of the elements 152 forms single-piece light confinement walls.

Preferably, the light confinement wall elements 152 are constituted in whole or in part by the same materials as the portions 13a, 13b, 13c of light-emitting diodes.

The similar nature of the light confinement wall elements 152 and the portions 13a, 13b and 13c of the light-emitting diodes and the arrangement of the light confinement walls of the method of the invention thus advantageously allow reducing the parasitic residues of material constituting the light-emitting diode elements by their adsorption or absorption by the light confinement wall elements 152 in the areas where the light-emitting diodes are absent.

The light confinement wall elements 152 and therefore also the light confinement walls 15 are, by way of example, at least partially, formed from semiconductor materials of group IV such as silicon or germanium or else mainly including a compound III-V, for example compounds III-N. Examples of the group III include gallium, indium, or aluminum. Examples of compounds III-N are GaN, AlN, InGaN or AlInGaN. Other elements of the group V can also be used, for example, phosphorus, arsenic or antimony. In general, the elements in the compound III-V can be combined with different mole fractions. It should be specified that the light confinement wall elements 152 can indifferently be formed from semiconductor materials predominantly including a compound II-VI. The dopant can be selected, in the case of a compound III-V, from the group comprising a P-type dopant of the group II, for example magnesium, zinc, cadmium or mercury, a P-type dopant of the group IV, for example, carbon, or a N-type dopant of the group IV, for example silicon, germanium, selenium, sulfur, terbium or tin.

In general, the different layers constituting the light confinement wall elements 152 can be obtained by any technique of those skilled in the art such as for example: chemical vapor deposition (CVD), an atomic layer deposition (ALD), or physical vapor deposition (PVD) or else by epitaxy (MOVPE, MBE) or molecular beam epitaxy or else by laser-assisted deposition (PLD for Pulsed Laser deposition).

Figure 14:
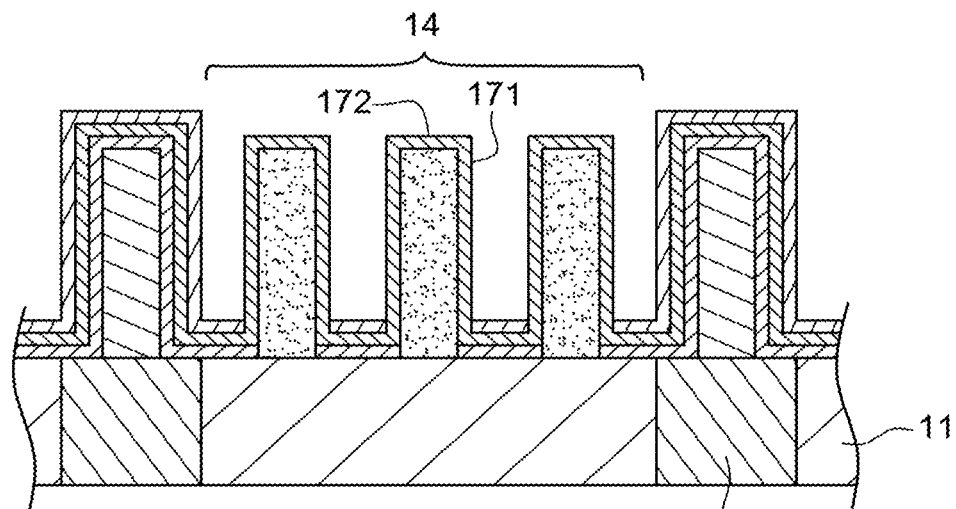
FIGS. 14 and 15 represent, in sectional view, two variants of optoelectronic devices which are manufactured according to the manufacturing method.

Advantageously, the light confinement walls 15 are not electrically connected to the substrate 11. Those skilled in the art can use any technique to electrically insulate the light confinement walls 15, for example by creating a discontinuity in the conductive seed layer around the light confinement walls 15. Those skilled in the art will also be able, for example, to create deep insulation trenches in the substrate 11 by the face which is opposite to the support face 111 and fill them with an electrical insulator. Those skilled in the art might also choose to create a discontinuity of the upper electrode layer 17 to electrically insulate, by the free face, the light confinement walls 15. These different techniques are described, by way of example, in the patent application FR-A1-3053530. FIG. 14 illustrates an example of insulating trenches which are placed at the light confinement walls 15.

Being advantageously electrically insulated, the light confinement walls advantageously do not emit light, which is advantageous so as not to emit interference light with that coming from the light-emitting diodes 13.

In a second embodiment, and as illustrated in FIG. 1, the areas 151a which are adapted to the formation of light confinement wall elements 152 are arranged and dimensioned so as to obtain sub-areas 151a which are distant from each other by 50 nm to 5 μm. By this method, the complete formation of the light confinement walls 15, takes place by coalescing the light confinement wall elements 152. FIGS. 10 and 11 illustrate this method, where from discontinuous elements 152 of light confinement walls, by growth and coalescence of each of these light confinement wall elements 152, a one-piece light confinement wall is obtained. The coalescence may however not be entirely complete and allow free spaces 152a to appear within or between the light confinement walls 152.

An electrical insulation layer 16 can then be deposited in these free spaces 152a, for example during one of the subsequently specified steps.

Figure 9:
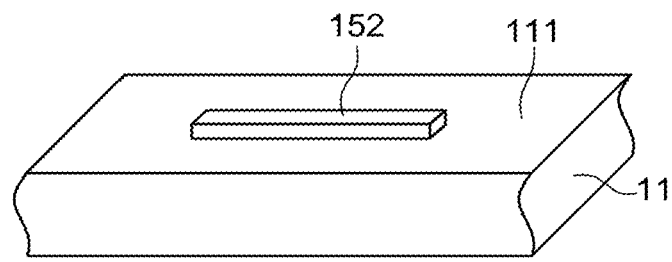
FIG. 9 represents a perspective view of the formation of light confinement wall elements.

In a third embodiment, and as illustrated in FIGS. 2, 3 and 9, the areas 151 which are adapted to the formation of light confinement wall elements 152 are arranged and dimensioned so as to obtain, by growth, light confinement wall elements 152 directly in one piece.

In a fourth embodiment, the areas 151 preliminary to the formation of the light confinement wall elements 152 are arranged at a distance D1 from the areas preliminary to the formation of light-emitting diode portions 131 located at the periphery of the same sub-pixel area 14 defined by the arrangement of the light confinement walls 15. The distance D1 can advantageously satisfy at least one of the following conditions:
 the distance D1 is comprised between half and 100 times the pitch separating all or part of two adjacent light-emitting diodes 13,
 the distance D1 is comprised between one time and 500 times the diameter of all or part of the light-emitting diodes 13,
 the distance D1 is less than or equal to twice the diffusion length of the atomic species composing at least all or part of at least one light-emitting diode 13.

The periodic distance separating at least two light-emitting diodes 13 is called call «pitch».

Preferably, D1 is comprised between 2.5 and 50 µm and ideally between 5 and 25 µm.

The distance D1 is advantageous because for cases where the heights of light-emitting diodes 13 are in the range of 0.5 to 40 µm in height, with a pitch of 5 µm inter diode 13, the light confinement wall elements 152 allow to limiting by capture of residual material, during their formation, to less than 20% the difference between the individual diameter of the light-emitting diode elements 13 located on the periphery of the same sub-pixel area 14 and the average diameter of the light-emitting diode elements 13a, 13b, 13c of the concerned sub-pixel area 14.

In a fifth embodiment, advantageously, the light confinement wall elements 152 are formed, with the same technique, with the same materials as the light-emitting diode portions 13a, 13b, 13c, under the same conditions as the light-emitting diode portions 13a, 13b, 13c and obtained at the same time as the light-emitting diode portions 13a, 13b, 13c.

The similarity of material between the light-emitting diode portions 13a, 13b, 13c and the light confinement wall elements 152 advantageously allows that the light confinement wall elements 152 have the ability to capture all or part of the material used for the formation of the light-emitting diode elements 13a, 13b, 13c during the common portion of their forming step e).

The term «ability to capture the material» means the capacity of the structures to attract the material (atoms or molecules) to themselves in order to get larger or grow during the growth, and this by adsorption, absorption, epitaxy transformation or capture of the atoms/molecules provided during the growth phase.

This step e) advantageously takes place in whole or in part concomitantly with the step of forming the light-emitting diode elements 13a, 13b, 13c such that the formation d) of the light-emitting diode elements 13a, 13b, 13c located on the periphery of the same sub-pixel area 14 defined by the arrangement of the light confinement walls 15 is controlled by the formation, preferably with the same technique to save time, at the same time of the light confinement wall elements limiting the sub-pixel area 14.

The term «concomitantly» means an action occurring at the same time or simultaneously. This may involve using the same production technique to ensure a temporal simultaneity. This may also involve a spatial proximity, in the range of D1, of the diode elements 13a, 13b, 13c and light confinement wall elements 152 so that the simultaneity of the growth of the light-emitting diode elements 13a, 13b, 13c and light confinement wall elements 152 can allow an influence of the second elements on the first elements.

Indeed, the presence of previously described light confinement wall elements 152 advantageously allows limiting the material supply, by absorption or adsorption of material by the light confinement wall elements 152 during their growth, which is usually calibrated by those skilled in the art to form light-emitting diode elements 13a, 13b, 13c arranged according to a given density and which therefore becomes excess for the diode portions 13a, 13b, 13c which are located at the periphery of sub-pixel area 14 in the absence of light confinement walls 15.

Advantageously, with the presence of light confinement wall elements 152 placed at a distance D1, this method allows limiting to less than 20%, the difference between the diameter of the light-emitting diode elements 13a, 13b, 13c, which are located on the periphery of the sub-pixel area 14, defined by the arrangement of the light confinement walls 15 and the average diameter of the light-emitting diode elements 13a, 13b, 13c of the concerned sub-pixel area 14.

Advantageously, this method also allows limiting to less than 20%, the difference between the height of the light-emitting diode elements 13a, 13b, 13c located on the periphery of a sub-pixel area 14 and the average height of the light-emitting diodes 13 of the concerned sub-pixel area 14.

Advantageously, the method of the invention allows the wavelength emitted by each of the light-emitting diodes 13 of the same sub-pixel area 14 to be substantially homogeneous from one diode to the other, including for a light-emitting diode 13, located on the on the periphery relative to those located in the center. More preferably, all light-emitting diodes 13 included in the same sub-pixel area 14 emit light with a wavelength comprised between 0.98 times the average wavelength of the light emitted by the light-emitting diodes 13 of sub-pixel area 14 and 1.02 times the average wavelength of the light emitted by the light-emitting diodes 13 of the sub-pixel area 14. For example, for a target wavelength of 450 nm then the wavelength emitted thanks to the application of the method resulting from the invention allows obtaining a light emission comprised between 441 nm and 459 nm.

Figure 6:
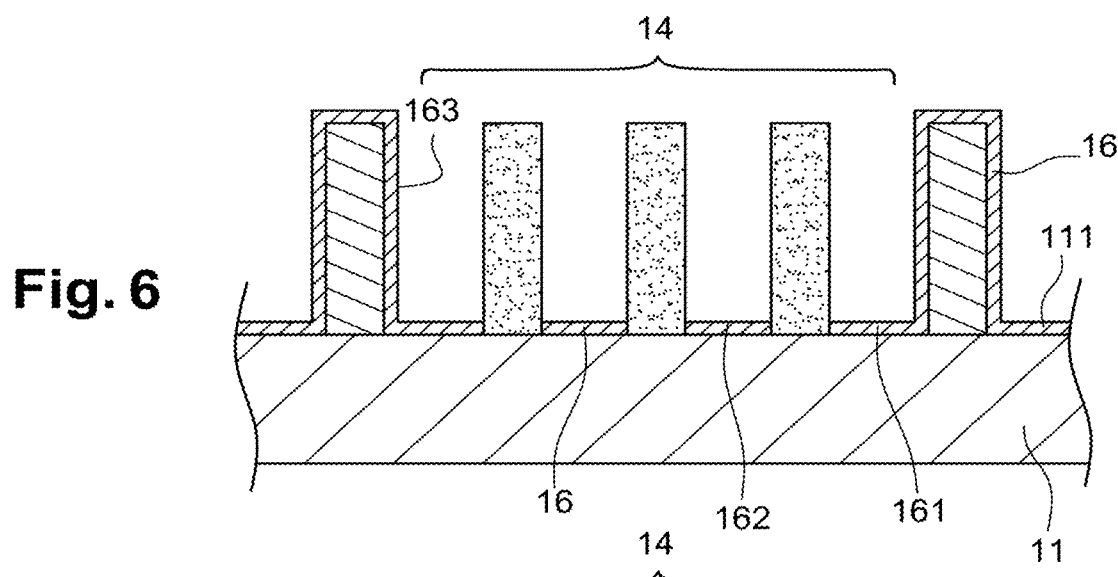

In order to address the problem of the difference in diameter of the light-emitting diodes 13 located on the periphery of the same sub-pixel area 14, those skilled in the art would have reduced the dimensions of the openings 131 preliminary to the formation of the light-emitting diode elements located at the periphery of the areas 14. This has a significant cost since it involves the very meticulous and a posteriori retouching of the photolithography masks necessary for the definition of the areas 131. In a sixth embodiment, and as illustrated in FIG. 6, the method includes a step f), after step e), of forming a layer of an electrically insulating material 16, said layer of electrically insulating material 16 being selectively formed on the outer surfaces 153 of the light confinement wall elements 152 as well as on the surfaces 112 defined by the spacing between the light confinement wall elements 152 and the light-emitting diode elements 13a, 13b, 13c as well as on the surfaces 113 defined by the spacing between the light-emitting diode elements 13a, 13b, 13c. The insulating layer 16 can be a dielectric material, for example of a silicon oxide, silicon nitride, silicon oxynitride, aluminum oxide, hafnium oxide, or of diamond material. This insulating layer 21 has a thickness for example comprised between 5 nm and 800 nm.

Figure 7:
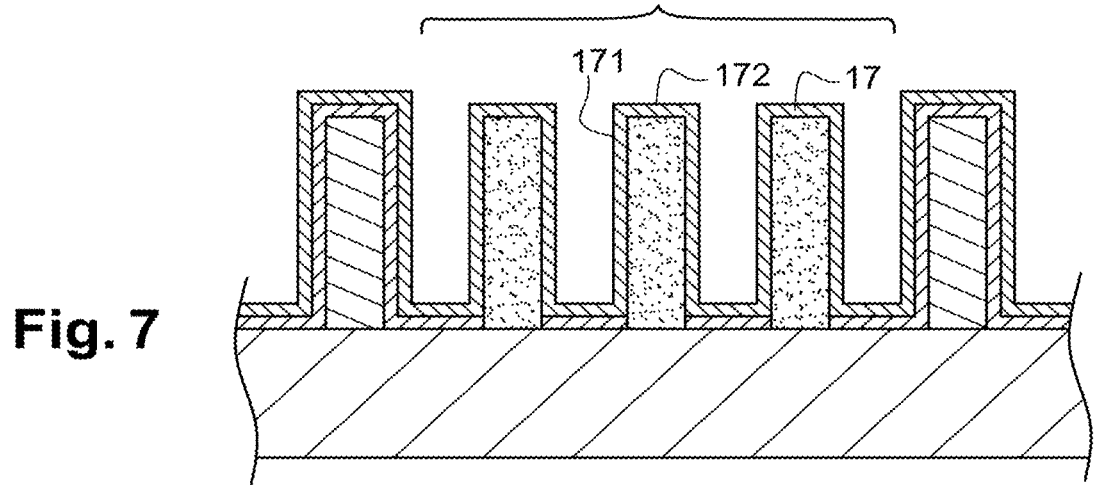

In a seventh embodiment, and as illustrated in FIG. 7, the method includes a step g) of forming an upper electrode layer 17 composed of at least one preferentially transparent conductive material, such as indium tin oxide ITO or ZnO doped for example with aluminum or gallium, on the free surface of the layer formed in step f). This upper electrode layer 17 allows carrying out the electrical contact on the third portion 13c of the light-emitting diodes 13. The upper electrode layer 17 may comprise a stack of several layers of conductive materials.

Figure 8:
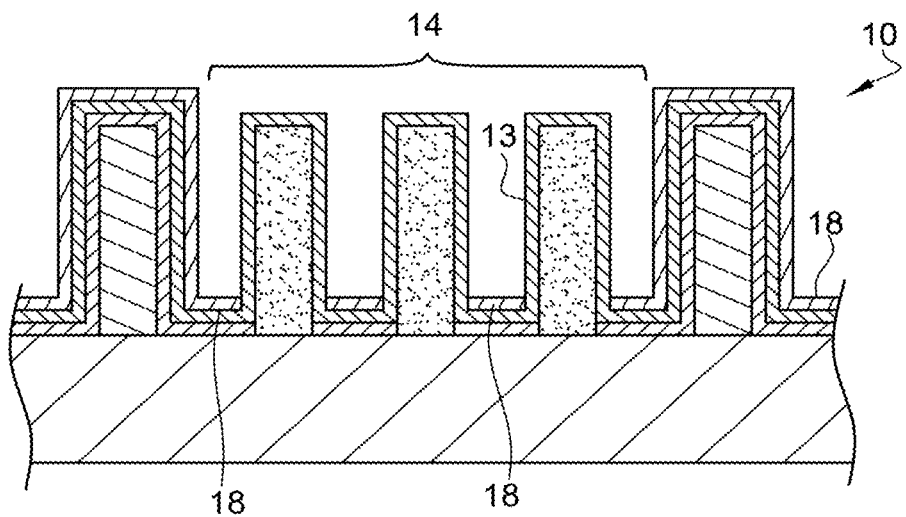

With reference to FIG. 8, in an eighth embodiment, the method includes a step h) of forming a layer 18 of a material blocking the electromagnetic waves from or being in the direction of the light-emitting diodes 13. The term «blocking the electromagnetic waves» means «being opaque or reflective». The layer 18 of material blocking the electromagnetic waves can also reflect or be opaque for the electromagnetic waves converted by the color converters such as, for example, quantum dots or else phosphors. Said layer 18 of opaque or reflective material is formed on the free surfaces resulting from step g) with the exception of the lateral 171 and top 172 surfaces of the light-emitting diodes 13. The material which is opaque or reflecting the electromagnetic waves can be formed from the same material or from a plurality of different materials deposited on top of each other. The reflective materials can be selected from aluminum, silver, nickel, platinum, or any other suitable material such as different optical index materials.

Figure 12:
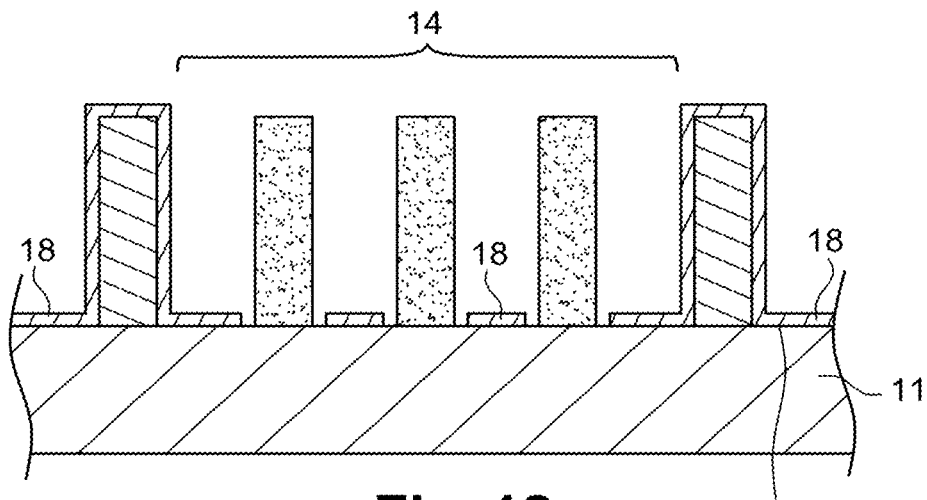
FIGS. 12 and 13 represent, in sectional view, two variants of optoelectronic devices which are manufactured according to the manufacturing method.

In a ninth embodiment and with reference to FIG. 12, the material 18 which is opaque or reflecting the electromagnetic waves emitted by the light-emitting diodes 13, is formed directly on all or part of the outer surfaces 153 of the light confinement wall elements 152 and all or part of the surfaces 112 defined by the spacing between the light confinement wall elements 152 and the light-emitting diodes 13 as well as all or part of the surfaces 113 defined by the spacing between the light-emitting diodes 13 with the exception of the lateral 171 and top 172 surfaces of the light-emitting diodes 13.

Figure 13:
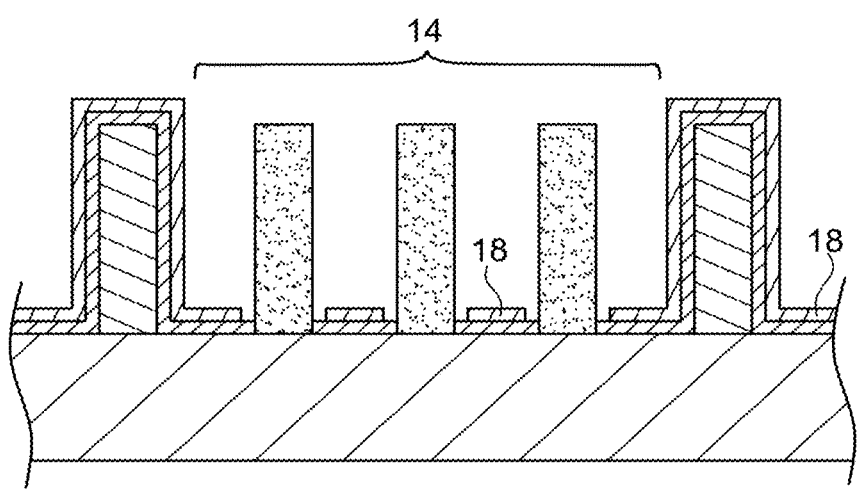

In a tenth embodiment and with reference to FIG. 13, the material 18 which is opaque or reflecting the electromagnetic waves emitted by the light-emitting diodes 13, is formed directly on all or part of the free surfaces 171 of the insulating material layer 16 which are obtained in step f), with the exception of the lateral 171 and tops 172 walls of the light-emitting diodes 13.

With reference to FIG. 14, an eleventh embodiment corresponds to the realization of the electrical insulation of the light confinement wall elements 152 by the formation of insulating trenches 20, by any technique known to those skilled in the art, from the rear face 114.

Figure 15:
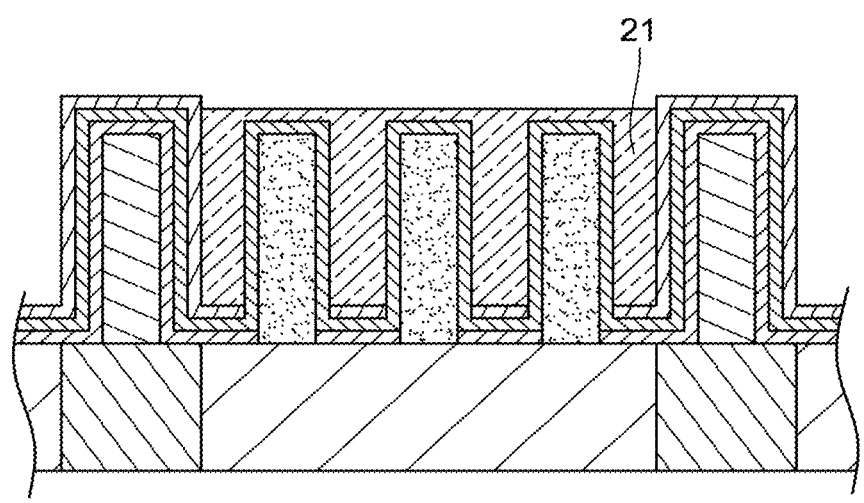

With reference to FIG. 15, a twelfth embodiment corresponds to a step i) of at least partially covering the light-emitting diodes 13 of the same sub-pixel area 14 by an encapsulation layer 21. The encapsulation layer 21 can be made of an insulating material which is at least partially transparent. The minimum thickness of the encapsulation layer 21 is comprised between 250 nm and 50 µm such that the encapsulation layer 21 covers all or part of the light-emitting diodes and all or part of at least the same sub-pixel area 14. The encapsulation layer 21 can be made of an inorganic material which is at least partially transparent. By way of example, the inorganic material is selected from the group comprising silicon oxides of the $SiO_x$ type where x is a real number comprised between 1 and 2 or $SiO_yN_z$ where y and z are real numbers comprised between 0 and 1 and aluminum oxides, for example $Al_2O_3$. The encapsulation layer 21 can be made of an organic material which is at least partially transparent. By way of example, the encapsulation layer 21 is a silicone polymer, an epoxy polymer, an acrylic polymer or a polycarbonate. In another example, the encapsulation layer 21 is composed with at least one phosphor. Said phosphor can for example absorb deep blue or UV light emitted by the light-emitting diodes and transform it into green or red, or even blue. The advantage of using a blue phosphor and not the natural emission of the light-emitting diodes is an insensitivity of the quality of the blue or UV to the color variations of the spontaneous emission of the wires, from one batch to another or within the same substrate. A selective phosphor deposition method consists in mixing the phosphor grains of a first color with photosensitive silicone resin, then after spreading over the entire substrate and the light-emitting diodes, in fastening phosphors on the areas 14 desired by photolithography. The operation is repeated with a second phosphor for a second color and as many times as there are areas 14 defined by the arrangement of light confinement walls 15 of different colors. Another method is to use inkjet type printing equipment with an «ink» composed of the silicone-phosphor mixture and specific adjuvants. By printing, from a mapping and the orientation and a referencing of the areas 14 defined by the arrangement of the light confinement walls 15, the phosphors are deposited at the required locations. Furthermore, the encapsulation layer 21 may contain quantum dots.

The invention claimed is:

1. A method for manufacturing an optoelectronic device including the following steps of:
    a) forming a substrate having a support face;
    b) forming a first series of first areas on the support face which are adapted to the formation of all or part of light-emitting diodes, said light-emitting diodes comprising a first portion doped according to a first type of doping, a second portion forming an active area and a third portion doped according to a second type of doping;
    c) forming a second series of second areas on the support face, which are adapted to the formation of at least one light confinement wall element capable of forming a light confinement wall, the second areas being distinct from the first areas, the second areas defining therebetween sub-pixel areas;
    d) forming, from the first areas, all or part of light-emitting diodes;
    e) forming, by the same technique as in step d), from the second areas, all or part of light confinement wall elements, concomitantly with all or part of the light-emitting diodes which are formed in step d).

2. The method according to claim 1, wherein at least two of the second areas adapted to the formation of light confinement wall elements, are arranged to allow obtaining light confinement walls by coalescence of light confinement wall elements.

3. The method according to claim 1, wherein all or part of the second areas adapted to the formation of light confinement wall elements are arranged to allow the formation of the light confinement wall elements in one piece.

4. The method according to claim 1, wherein the light confinement walls at least partially contain portions made of electrically insulating material.

5. The method according to claim 1, wherein the light-emitting diodes have a wire shape which is elongate along a longitudinal axis, extending in a transverse direction of the optoelectronic device oriented transversely to the support face.

6. The method according to claim 1, wherein the first, second and third portions of the light-emitting diodes are stacked parallel to the support face.

7. The method according to claim 1, wherein all or part of the light-emitting diodes of the same sub-pixel area are positioned at a distance relative to the light confinement wall elements, the distance satisfying at least one of the following conditions:
the distance is comprised between half and 100 times the pitch separating all or part of two adjacent light-emitting diodes,
the distance is comprised between one time and 500 times the diameter of all or part of the light-emitting diodes,
the distance is less than or equal to twice the diffusion length of the atomic species composing all or part of the light-emitting diodes.

8. The method according to claim 1, wherein the light confinement wall elements which are formed in step e) have an ability to capture all or part of the material used in step d) for the formation of the first, second and third portions of light-emitting diodes.

9. The method according to claim 1, wherein the light confinement wall elements are formed, in whole or in part, substantially of the same materials as the first, second and third portions of light-emitting diodes.

10. The method according to claim 1, wherein all or part of the light confinement walls is made concomitantly with the formation of the first portion of the light-emitting diodes, and concomitantly with the formation of the second portion of the light-emitting diodes.

11. The method according to claim 1, wherein the light confinement walls comprise a first element doped according to a first type of doping formed concomitantly with the first portion doped according to a first type of doping of the light-emitting diodes, the light confinement walls further comprising a second element, capable of constituting an active area, obtained concomitantly with the second portion forming the active area of the light-emitting diodes.

12. The method according to claim 1, further including a step f), implemented after step e), of forming a layer of an electrically insulating material, said electrically insulating material layer being formed, in a selective manner, on the outer surfaces of the light confinement walls, on the surfaces defined by the spacing between the light confinement walls and the light-emitting diodes, and on the surfaces defined by the spacing between all or part of the light-emitting diodes.

13. The method according to claim 12, further including a step g) of forming an upper electrode on the surface free of electrically insulating material resulting from step f).

14. The method according to claim 13, wherein each light confinement wall is electrically insulated from at least one element selected from: the other light confinement walls of the sub-pixel area, all or part of the upper electrodes and all or part of conductive portions of the substrate.

15. The method according to claim 13, further including a step h) of forming a layer of material which is opaque or reflecting electromagnetic waves from or in the direction of the light-emitting diodes, said layer of material blocking the electromagnetic waves being formed on the free surfaces resulting from step g) with the exception of the lateral and top surfaces of the light-emitting diodes.

16. The method according to claim 15, wherein the layer of material which is opaque or reflecting the electromagnetic waves, is formed directly on all or part of the outer surfaces of the light confinement walls, on all or part of the surfaces defined by the spacing between the light confinement walls and the light-emitting diodes and on all or part of the surfaces defined by the spacing between the light-emitting diodes with the exception of the lateral and top walls of the light-emitting diodes.

17. The method according to claim 15, wherein the layer of material which is opaque or reflecting the electromagnetic waves, is formed directly on all or part of the free surfaces of the insulating material layer which are obtained in step f), with the exception of the lateral and top walls of the light-emitting diodes.

18. The method according to claim 1, wherein the light confinement walls do not emit light.

19. The method according to claim 1, further including a step i) of forming an encapsulation layer at least partially surrounding the light-emitting diodes contained in the same sub-pixel area.

20. An optoelectronic device obtained by implementing a manufacturing method according to claim 1, wherein all or part of the light confinement walls are formed of the same materials as all or part of the first, second and third portions of light-emitting diodes.

21. The optoelectronic device according to claim 20, wherein all light-emitting diodes comprised in the same sub-pixel area have a diameter comprised between 0.8 times the average diameter of the light-emitting diodes of the sub-pixel area and 1.2 times the average diameter of the light-emitting diodes of the sub-pixel area and a height comprised between 0.8 times the average height of the light-emitting diodes of the sub-pixel area and 1.2 times the average height of the light-emitting diodes of the sub-pixel area.

22. The optoelectronic device according to claim 20, wherein all light-emitting diodes comprised in the same sub-pixel area emit a light of a wavelength comprised between 0.98 times the average wavelength of the light emitted by the light-emitting diodes of the sub-pixel area and 1.02 times the average wavelength of the light emitted by the light-emitting diodes of the sub-pixel area.

* * * * *